United States Patent
Petitbon et al.

(10) Patent No.: US 6,589,859 B2
(45) Date of Patent: Jul. 8, 2003

(54) METHOD OF MANUFACTURING AN ELECTRONIC POWER COMPONENT, AND AN ELECTRONIC POWER COMPONENT OBTAINED THEREBY

(75) Inventors: Alain Petitbon, Pau (FR); Nathalie Martin, Horgues (FR); Xavier Jorda, Barcelona (ES); Philippe Godignon, Saint Cugat (ES); David Flores, Martorell (ES)

(73) Assignee: Alstom, Paris (FR)

( * ) Notice: Subject to any disclaimer, the term of this patent is extended or adjusted under 35 U.S.C. 154(b) by 0 days.

(21) Appl. No.: 09/899,078

(22) Filed: Jul. 6, 2001

(65) Prior Publication Data

US 2002/0006685 A1 Jan. 17, 2002

(30) Foreign Application Priority Data

Jul. 7, 2000 (FR) .............................. 00 08931

(51) Int. Cl.$^7$ .......................... H01L 21/44; H01L 23/48
(52) U.S. Cl. ................... 438/611; 438/612; 257/735
(58) Field of Search ................. 438/611, 612, 438/106, 108, 800, 597; 29/874; 257/734, 735, 779

(56) References Cited

U.S. PATENT DOCUMENTS

| | | | |
|---|---|---|---|
| 3,838,984 A | 10/1974 | Crane et al. | |
| 4,811,081 A | 3/1989 | Lyden | |
| 4,967,261 A | 10/1990 | Niki et al. | |
| 4,977,441 A | 12/1990 | Ohtani et al. | |
| 5,001,545 A | * 3/1991 | Kalfus et al. | 357/70 |
| 5,016,082 A | * 5/1991 | Roth | 357/70 |
| 5,277,756 A | 1/1994 | Dion | |
| 5,768,770 A | * 6/1998 | Horton et al. | 29/827 |
| 5,986,338 A | * 11/1999 | Nakajima | 257/700 |
| 5,994,222 A | * 11/1999 | Smith et al. | 438/689 |
| 6,083,772 A | * 7/2000 | Bowman et al. | 438/106 |
| 6,171,888 B1 | * 1/2001 | Lynch et al. | 438/123 |
| 6,221,750 B1 | * 4/2001 | Fjelstad | 438/611 |
| 6,319,755 B1 | * 11/2001 | Mauri | 438/119 |
| 6,396,127 B1 | * 5/2002 | Munoz et al. | 257/666 |

FOREIGN PATENT DOCUMENTS

| | | |
|---|---|---|
| EP | 0 966 038 | 12/1999 |
| FR | 2 787 920 | 6/2000 |

OTHER PUBLICATIONS

French Search Report dated Feb. 28, 2001.

* cited by examiner

*Primary Examiner*—Kamand Cuneo
*Assistant Examiner*—Scott B. Geyer
(74) *Attorney, Agent, or Firm*—Sughrue Mion, PLLC

(57) ABSTRACT

In the method, the following are placed in succession on a substrate: at least one conductive layer and at least one semiconductor power circuit, and metal connection tabs are fitted to the face of the semiconductor circuit facing away from the conductive layer by metallizing a metal film. Thereafter, at least one solder element is placed on each film obtained in this way, at least one conductive member is applied to the or each solder element on its side facing away from the metal film, and the or each solder element is caused to melt so as to secure the or each conductive member to the or each metal film.

19 Claims, 4 Drawing Sheets

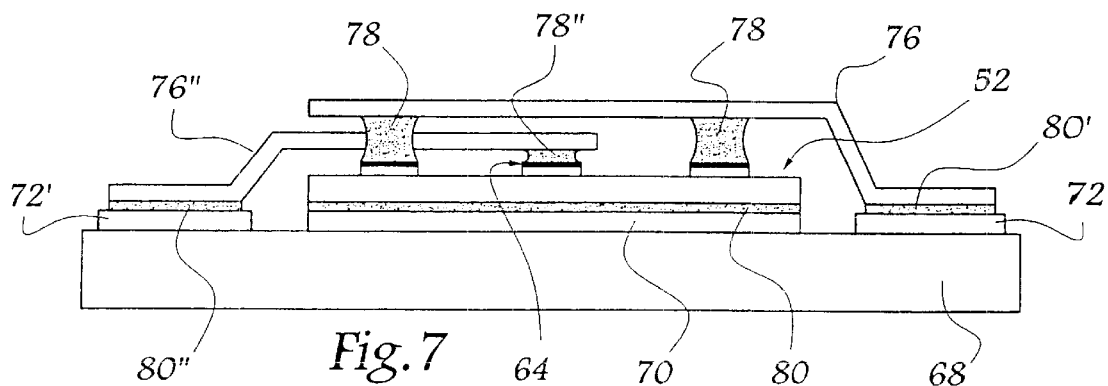
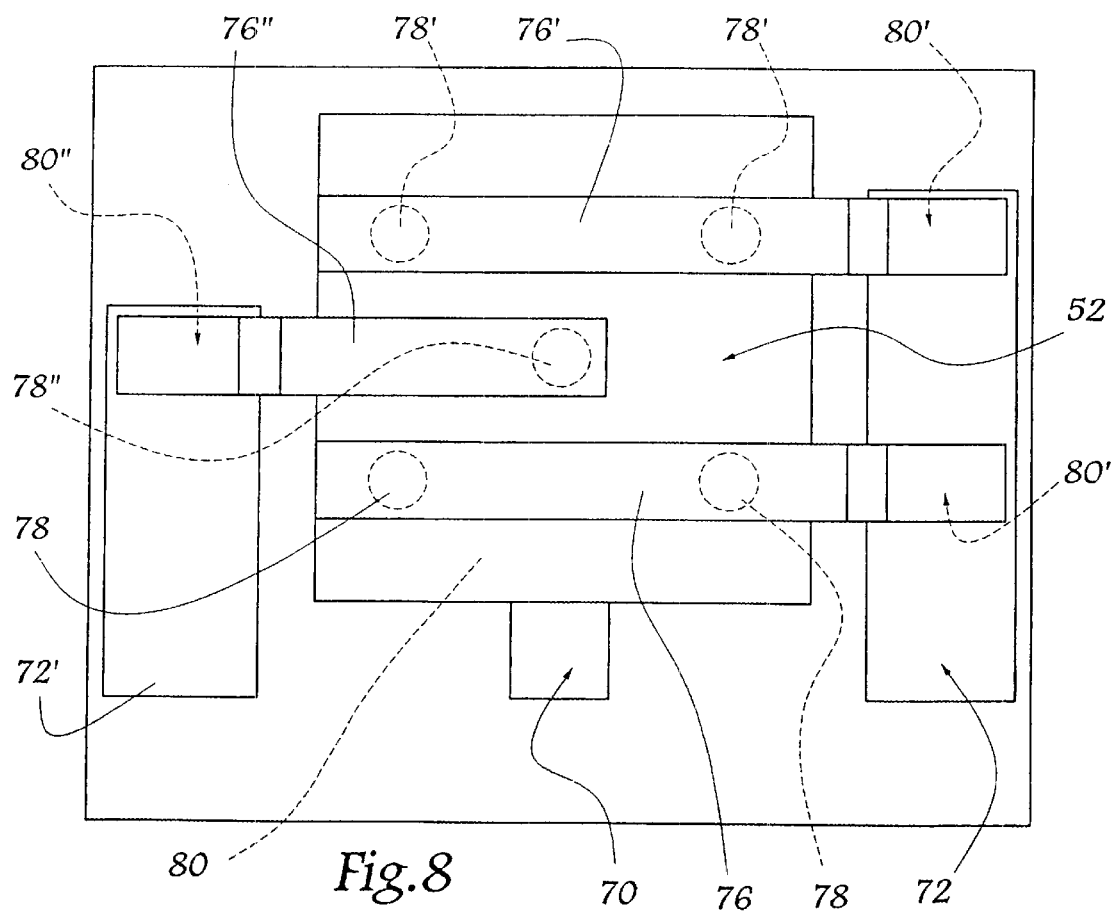

METHOD OF MANUFACTURING AN ELECTRONIC POWER COMPONENT, AND AN ELECTRONIC POWER COMPONENT OBTAINED THEREBY

The present invention relates to a method of manufacturing an electronic power component, and to an electronic power component obtained thereby.

BACKGROUND OF THE INVENTION

Usually, an electronic power component, in particular one for use in the technical field of rail traction, comprises a substrate having a plurality of conductive layers applied thereto. At least one semiconductor power circuit is disposed on each of the layers, for example an insulated gate bipolar transistor (IGBT), or indeed a diode.

Each semiconductor circuit is provided on its face remote from the above-mentioned conductive face with metal connection tabs, and aluminum wires with a typical diameter of 380 microns ($\mu$m) to 500 $\mu$m being bonded thereto. Each of these wires is also bonded to one of the conductive layers covering the substrate.

That electronic power component, of known type, nevertheless suffers from various drawbacks. The above-mentioned aluminum wires give rise to numerous problems of reliability, associated with the mechanical stresses that act at the bonds between the wires and the corresponding connection tabs.

Furthermore, the wires give rise to parasitic inductance which can limit the performance of the electronic power component as a whole. Finally, the component does not optimize removal of heat, since heat can be removed through only one face of the component.

In order to resolve the above-mentioned drawbacks, at least to some extent, power connections have been proposed that do not make use of the above-mentioned aluminum wires. A manufacturing method has been implemented making use of pressed contacts, for example as described in EP-A-0 784 342.

Although that method of making components provides a solution that is satisfactory in terms of removing heat, it suffers from other drawbacks, in particular it requires complicated pressing mechanisms to be used. Furthermore, it is not convenient to implement insofar as it requires special semiconductor circuits.

OBJECTS AND SUMMARY OF THE INVENTION

In order to mitigate all of those drawbacks, the present invention seeks to propose a method of manufacturing an electronic power component, which method is simple and quick to implement while enabling an electronic component to be obtained that is robust and that guarantees satisfactory removal of heat.

To this end, the invention provides a method of manufacturing an electronic power component in which the following are placed in succession on a substrate: at least one conductive layer and at least one semiconductor power circuit, and in which metal connection tabs are fitted onto the face of the semiconductor circuit that faces away from the conductive layer, wherein the step which consists in applying said connection tabs to said face of the semiconductor circuit comprises a step of depositing a metal film by metallization, wherein at least one solder element is placed on the or each film obtained in this way, a conductive member is applied onto the or each solder element on its side remote from the metal film, and wherein the or each solder element is caused to melt so as to secure the or each conductive member with the or each metal film.

The invention makes it possible to achieve the above-mentioned objects.

The method of the invention makes use of manufacturing steps that are simple and easy to implement.

Furthermore, the component obtained thereby possesses improved reliability insofar as the bonding by soldering makes it possible to reduce to a significant extent the differential expansion that is inherent to prior use of metal connection wires.

Furthermore, the method of the invention provides satisfactory removal of heat from both opposite faces of each semiconductor circuit.

Finally, the method is of considerable flexibility insofar as it makes it possible to manufacture electronic power components using semiconductor circuits of different kinds, without major modification to the steps of the method.

In a first variant of the invention, the step of depositing the metal film is performed directly on a blank semiconductor die belonging to said semiconductor power circuit.

In a second variant of the invention, the step of depositing said metal film is performed on a preexisting connection member of said semiconductor circuit.

By way of example, such a connection member is constituted by a piece of aluminum foil covered in a layer of aluminum oxide. This implementation is advantageous given that it makes it possible to treat conventional prior art components, and even to upgrade used components.

According to another feature of the invention, the metal film is constituted by a titanium-nickel alloy.

According to another feature of the invention, the step of depositing the metal film is implemented by performing metallization through holes in a mask. This is advantageous in terms of manufacturing convenience insofar as the mask can be placed directly on the semiconductor circuit that is to be coated.

According to another feature of the invention, each solder element has a transverse dimension greater than 0.5 mm, and preferably greater than 1 mm. The term "transverse dimension" is used to mean either the diameter of the solder element, or else its greatest width.

In a first variant of the invention, each solder element is constituted by a preformed element, in particular a ball. This is advantageous, given that such preformed elements are easily stored. Furthermore, during manufacture of the power components, such stored preformed elements can be conveyed towards each metal film through openings in the mask as mentioned above.

In a second variant of the invention, each solder element is constituted by a measured-out quantity of solder.

According to another feature of the invention, each solder element is made of a tin-lead-silver alloy.

In a first implementation of the invention, the step of melting the or each solder element includes a primary melting stage for bonding each solder element to the metal film, the or each conductive member is then applied to the or each solder element after said primary stage, and a secondary melting stage is provided enabling each solder element to be secured to the corresponding conductive member. Once the primary melting stage has been performed, this implementation makes it possible to position each solder element in stable manner on the metal tab that it covers.

In a second implementation of the invention, each conductive member is applied to each solder element, and then said solder element is melted in a single step. This implementation is advantageous in terms of speed and simplicity.

According to another advantageous feature of the invention, each semiconductor power circuit is secured onto a corresponding conductive layer by interposing a film of solder between said circuit and said layer, and then by causing said film to melt, the film and each solder element being made out of the same material. This measure guarantees that implementation is highly convenient and gives rise to manufacturing costs that are low.

According to a particularly advantageous feature of the invention, both said solder film and each solder element are melted in a single step. By way of example, this melting is performed in an oven at a temperature lying in the range 180° C. to 300° C.

This measure serves to reduce the time required to manufacture the electronic component quite considerably. Each semiconductor circuit is secured in a single step on a corresponding conductive layer and simultaneously each conductive member is secured to the metal film with which the semiconductor circuit is provided.

The invention also provides an electronic power component comprising a substrate, at least one conductive layer supported by said substrate, and at least a first semiconductor power circuit placed on said conductive layer and having metal connection tabs secured via their faces facing away from the substrate to at least one conductive member, said component being made using the method as defined above.

According to other features of the invention:

the component includes at least two conductive members that are insulated from each other;

these two conductive members comprise an emitter and a grid, at least one of them being common to a plurality of semiconductor circuits placed on said substrate; and the component further comprises at least one additional semiconductor circuit fitted onto the or each conductive member on its face facing away from said first semiconductor circuit.

BRIEF DESCRIPTION OF THE DRAWINGS

The invention is described below with reference to the accompanying drawings given purely as non-limiting examples, and in which:

FIGS. 7 and 8 are respectively a side view and a plan view showing a first embodiment of an electronic power component obtained by the invention.

MORE DETAILED DESCRIPTION

Figure 1:
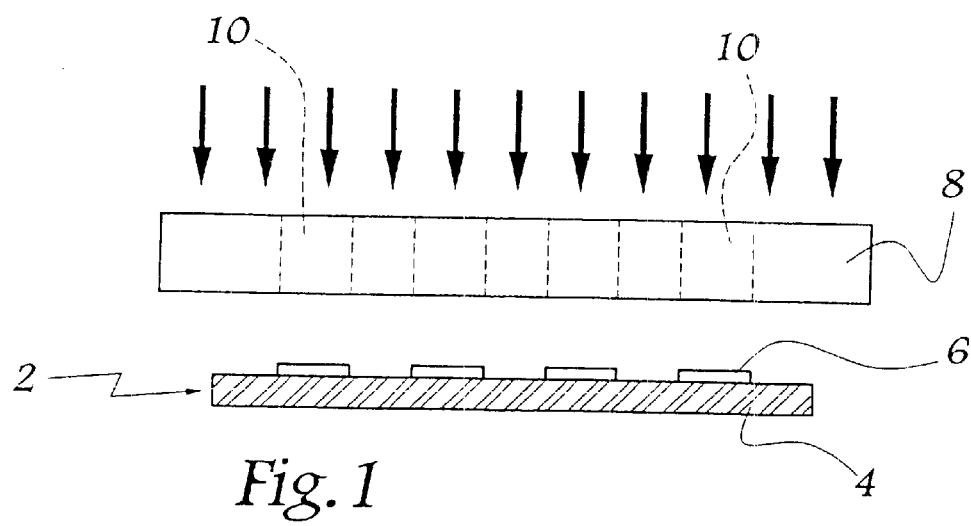
FIGS. 1 to 3 are side and plan views respectively showing three successive stages in the deposition of a metal film on a semiconductor power circuit by metallization.
Figure 2:
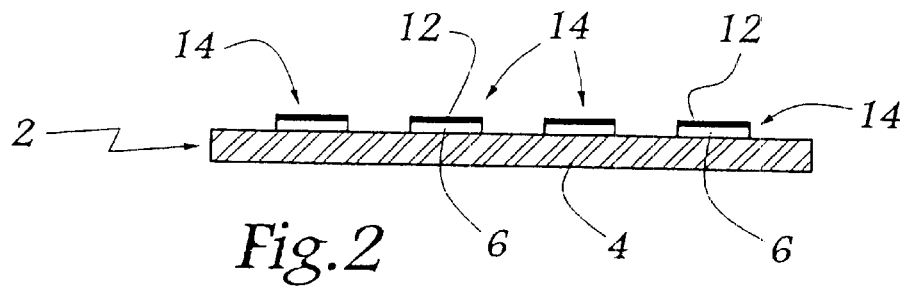
Figure 3:
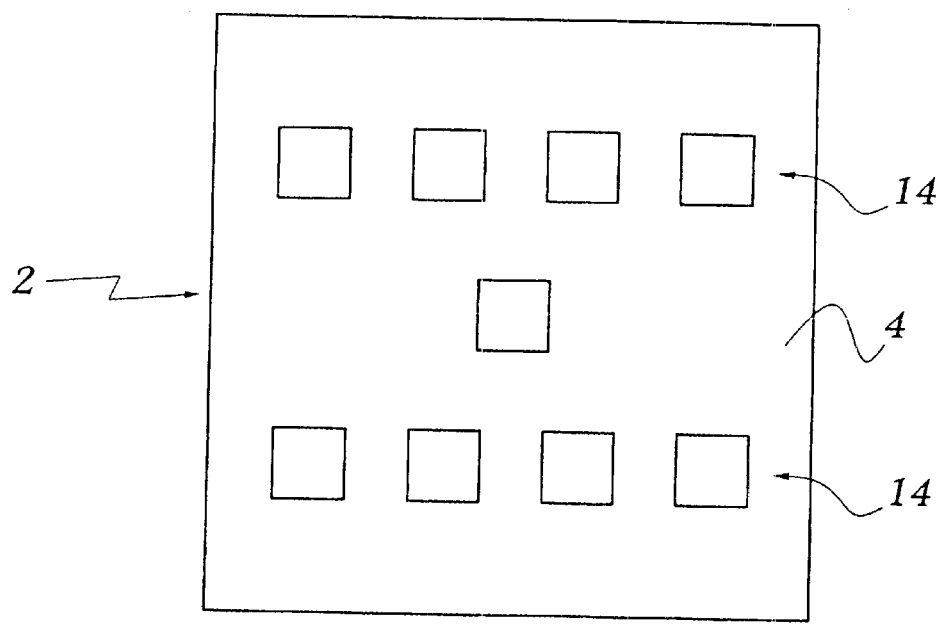

FIGS. 1 to 3 show a step of metallizing a semiconductor power circuit. This circuit, given overall reference 2, comprises a semiconductor die 4 surrounded by a plurality of preexisting connection members, specifically pieces of foil 6 visible in FIG. 1. These pieces of foil, e.g. made of aluminum, are covered in an oxide layer (not shown) on their faces remote from the die 4. This layer is formed during oxidation of the aluminum foil in ambient air.

The metallization step consists initially in bringing a mask 8 having holes 10 to the vicinity of the pieces of foil 6. Thereafter the foil 6 is coated through the above-mentioned holes 10. This metallization is performed in conventional manner, e.g. by thermal evaporation, or indeed by electron beam evaporation, or the like. By way of example, the metal used is a titanium-nickel alloy.

This coating step leads to a metal film 12 being formed which extends over the oxide layer covering each piece of foil. Each piece of foil 6 and the film 12 together form a metal connection tab given overall reference 14.

As a variant, the mask 8 could be placed directly on the surface of the die 4 so that the holes 10 open out to the free surface of each piece of foil 6. It is also possible to perform the metallization step directly on a blank semiconductor die, analogous to that referenced 4 in FIGS. 1 to 3.

Figure 4:
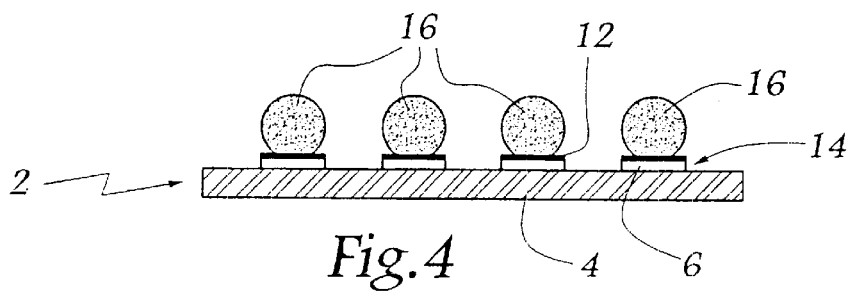
FIGS. 4 to 6 are side views showing three successive stages in securing a conductive member to the semiconductor power circuit of FIGS. 1 to 3.
Figure 5:
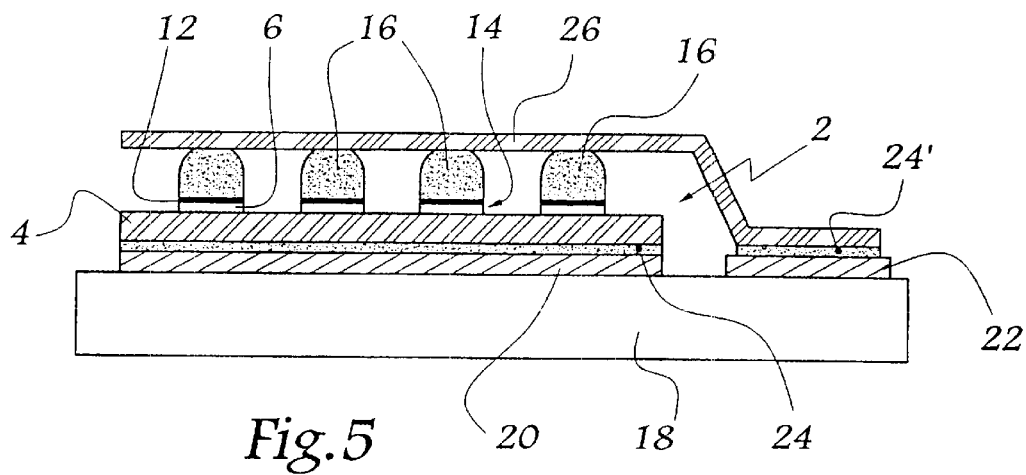
Figure 6:
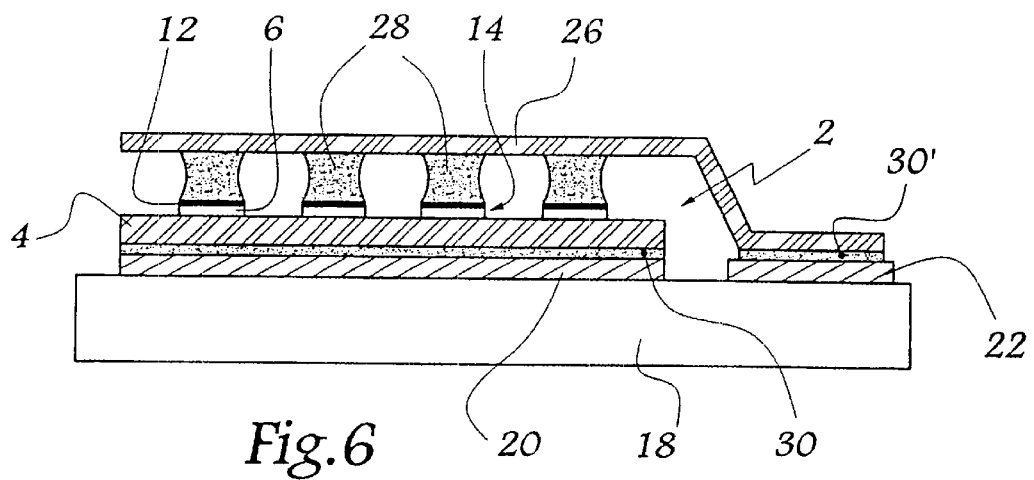

FIGS. 4 to 6 show soldering stages enabling the semiconductor circuit 2 to be secured to a fitted conductive member.

Initially, as shown in FIG. 4, a solder element 16 is applied to each of the tabs 14 formed in the step shown in FIGS. 2 and 3. These elements 16 are in the form of balls which are advantageously conveyed to the tabs 14 via the holes 10 through the mask 8 (not shown in FIG. 4).

Thereafter, primary melting of each ball 16 is performed, where the balls are made out of a tin-lead-silver alloy, for example, so as to secure the balls to the tabs 14.

Then, as shown in FIG. 5, the semiconductor circuit 2 needs to be secured to a substrate 18. The substrate receives a conductive layer 20 in conventional manner together with a conductive track 22, said layer and said track being insulated from each other.

The faces of the layer 20 and the track 22 facing away from the substrate 18 are then covered in solder films 24, 24' made out of the same alloy as the balls 16. The circuit 2 surmounted by the balls 16 is then placed on the solder film 24 and a conductive member 26 is placed on the face of the balls 16 that faces away from the circuit 2. The member 26 has a second end which is placed over the solder film 24' covering the track 22.

Thereafter, as shown in FIG. 6, the various elements shown in FIG. 5 are heated so as to cause the balls 16 to melt simultaneously, together with the films 24, 24'. This leads to a first series of solder joints 28 of approximately tubular shape being formed to secure the tabs 14 to the conductive member 26. The above-mentioned heating also causes plane solder joints 30 and 30' to be formed interconnecting the conductive layer 20 to the semiconductor circuit 2 and also the conductive track 22 to the second end of the conductive member 26.

In a variant, the primary and secondary melting stages shown respectively in FIGS. 5 and 6 can be implemented during a single melting step. Furthermore, the solder balls 16 can be replaced by measured-out quantities of a solder paste, dispensed onto each of the tabs 14.

FIGS. 7 and 8 show an electronic power component obtained using the method described with reference to FIGS. 1 to 6.

The component comprises a substrate 68 on which there are disposed a conductive layer 70 and two conductive tracks 72, the layer 70 and the tracks 72 being insulated from one another. A semiconductor power circuit 52 is applied on top of the layer 70 with a plane solder layer 80 being interposed between them;

Tabs 64 covering the face of the circuit 52 that faces away from the substrate 68 are secured to three conductive members 76, 76', and 76" via solder beads 78, 78', and 78". The opposite ends of the conductive members 76 and 76' are secured to the conductive track 72 with interposed plane solder portions 80' whereas the member 76" is secured to the track 72' via another plane solder portion 80".

As a variant, the two conductive members 76 and 76' could be united to constitute a single member with a notch to allow the other conductive member 76" to be received in insulated manner from the single conductive member formed in this way.

In a variant, it is also possible to fit a cooling element on at least one of the faces of the electronic power component. Thus, the free face of the substrate 68 and/or the free faces of the conductive members 76, 76', 76" can be put into contact with such a cooling element, of the type that is known per se.

Figure 9:
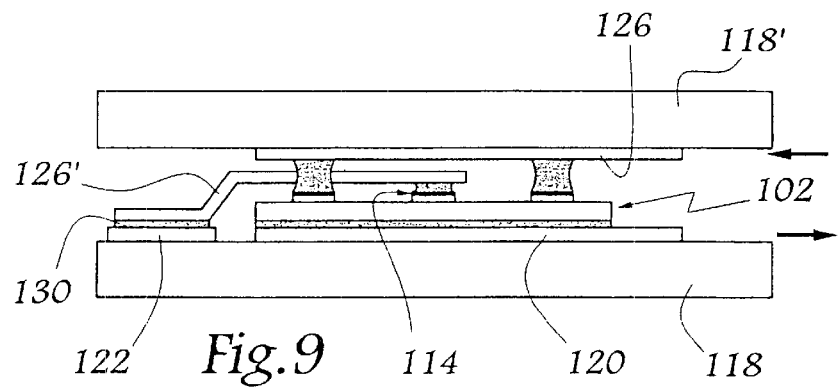
FIGS. 9 to 11 are side views showing three variant embodiments of an electronic power component obtained by means of the invention.

FIG. 9 shows a first variant of the electronic power component of the invention. In this figure, mechanical elements analogous to those of FIGS. 7 and 8 are given the same reference numbers plus 50.

The component of FIG. 9 comprises a bottom substrate 118, a conductive layer 120, a conductive track 122, and a semiconductor power circuit 102 having tabs 114 connected to two conductive members 126 and 126'. One of these members 126 is surmounted, away from the circuit 102, by a top substrate 118', while the other member 126' is connected to the conductive track 122 with an interposed plane portion of solder 130.

Figure 10:
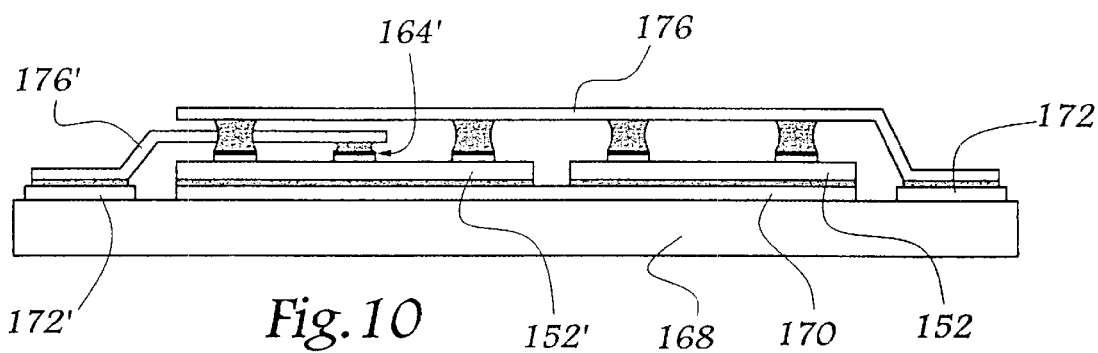

FIG. 10 shows an additional variant embodiment of an electronic power component of the invention. In this figure, elements analogous to those of FIGS. 7 and 8 are given the same reference numbers plus 100.

The FIG. 10 component comprises a substrate 168, a conductive layer 170, two conductive tracks 172 and 172', and two semiconductor power circuits 152 and 152'. A first conductive member 176 is connected to a plurality of tabs on the two semiconductor circuits 152, 152' and it is also connected onto the conductive track 172. Elsewhere, a second conductive member 176' is connected to a tab 164' on the second circuit 152', and to the conductive track 172'.

This electronic power component makes it possible to associate an insulated gate bipolar transistor (IGBT) with a diode, in an antiparallel configuration. The layer 170 forms a collector or cathode, the member 176 constitutes an emitter or anode, and the conductive member 176' forms a grid.

In a variant, the member 176' can extend further than shown in FIG. 9 so as to enable it to be put into communication with at least one tab on the first semiconductor circuit 152. Such an arrangement makes it possible to mount two IGBTs in parallel.

Figure 11:
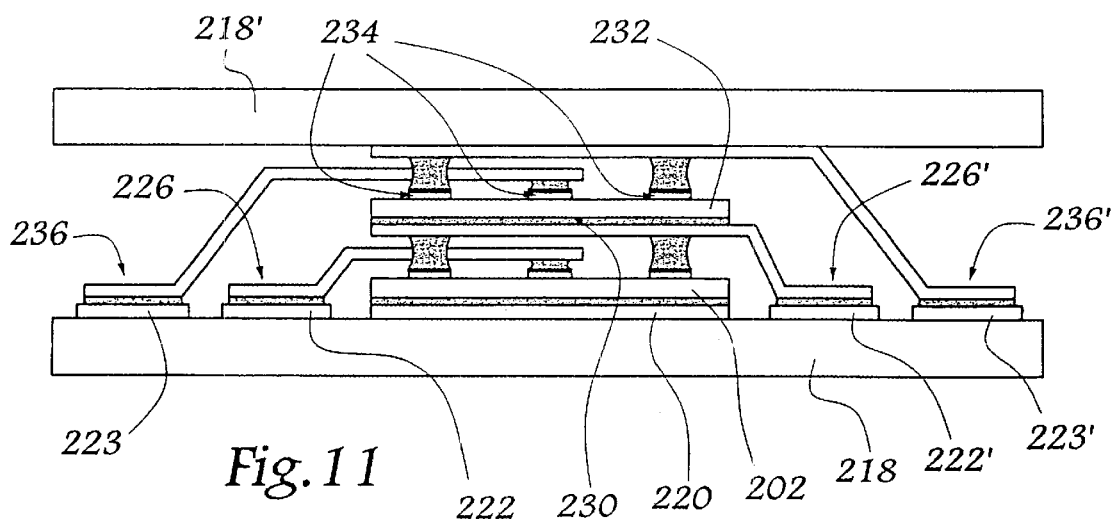

FIG. 11 shows an additional variant embodiment of the invention, and mechanical elements analogous to those of FIGS. 7 and 8 in this figure are given the same reference numbers plus 150.

The bottom substrate 218 supports a conductive layer 220, together with four conductive tracks 222, 222', 223, and 223'. The layer 220 supports a first semiconductor circuit 202 whose tabs are put into engagement with two conductive members 226 and 226'. One of these members 226 is secured to the conductive track 222 while the other member 226' is secured to the track 222'.

An additional semiconductor circuit 232 is placed on the conductive member 226' with a plane portion of solder 230 being interposed between them analogous to the portion 80 described above. The tabs 234 of the circuit 232 are put into engagement with two additional conductive members 236 and 236', one of which (236) is secured to the track 223, while the other one (236') is secured to the track 223'. Finally, a top substrate 218' is applied to the face of the member 236' that is remote from the circuit 232.

The arrangement of FIG. 11 makes it possible to connect two IGBTs in series, with all of the contacts being situated on the bottom substrate 218. The conductive member 226', the conductive member 236', and the conductive member 236 then respectively constitute the collector, the emitter, and the grid of the first IGBT. Furthermore, the conductive layer 220, the conductive member 226', and the conductive member 226 constitute respectively the collector, the emitter, and the grid of the second IGBT.

In a variant, provision can be made for the conductive members 236 and 236' to be put into contact with conductive tracks placed on the top substrate 218', instead of on the bottom substrate 218.

What is claimed is:

1. A method of manufacturing an electronic power component in which the following are placed in succession on a substrate: at least one conductive layer and at least one semiconductor power circuit, and in which metal connection tabs are fitted onto the face of the semiconductor circuit that faces away from the conductive layer, wherein the step of applying said connection tabs to said face of the semiconductor circuit comprises a step of depositing at least one metal film by metallization, wherein at least one solder element is placed on the or each metal film, a conductive member is applied onto the or each solder element on a side remote from the metal film, and wherein the or each solder element is caused to melt so as to secure the or each conductive member with the or each metal film.

2. A method according to claim 1, wherein the step of depositing the metal film is performed directly on a blank semiconductor die belonging to said semiconductor power circuit.

3. A method according to claim 1, wherein the step of depositing said metal film is performed on a pre-existing connection member of said semiconductor circuit.

4. A method according to claim 1, wherein the metal film is made of a titanium-nickel alloy.

5. A method according to claim 1, wherein the step of depositing the metal film is implemented by performing metallization through holes in a mask.

6. A method according to claim 1, wherein each solder element has a transverse dimension greater than 0.5 mm.

7. A method according to claim 1, wherein each solder element is constituted by a preformed element.

8. A method according to claim 1, wherein each solder element is constituted by a measured-out quantity of solder.

9. A method according to claim 1, wherein each solder element is made of a tin-lead-silver alloy.

10. A method according to claim 1, wherein the step of melting the or each solder element includes a primary melting stage for bonding each solder element to the metal film, wherein the or each conductive member is then applied to the or each solder element after said primary stage, and wherein a secondary melting stage is provided enabling each solder element to be secured to the corresponding conductive member.

11. A method according to claim 1, wherein each conductive member is applied to each solder element, and then said solder element is melted in a single step.

12. A method according to claim 1, wherein each semiconductor power circuit is secured onto a corresponding conductive layer by interposing a film of solder between said circuit and said layer, and then by causing said film to melt, the film and each solder element being made out of the same material.

13. A method according to claim 12, wherein both said solder film and each solder element are melted in a single step.

14. An electronic power component comprising a substrate, at least one conductive layer supported by said substrate, and at least a first semiconductor power circuit placed on and electrically connected to said conductive layer and having metal connection tabs secured via their faces facing away from the substrate to at least one conductive member, said component being made using the method according to claim 1.

15. A component according to claim 14, including at least two conductive members that are insulated from each other.

16. A component according to claim 15, wherein these two conductive members comprise an emitter and a grid, at least one of them being common to a plurality of semiconductor circuits placed on said substrate.

17. An electronic power component comprising a substrate, at least one conductive layer supported by said substrate, and at least a first semiconductor power circuit placed on said conductive layer and having metal connection tabs secured via their faces facing away from the substrate to at least one conductive member, said component being made using the method according to claim 1, further comprising at least one additional semiconductor circuit fitted onto the or each conductive member on a face facing away from said first semiconductor circuit.

18. A method according to claim 1, wherein each solder element has a transverse dimension greater than 1 mm.

19. A method according to claim 7, wherein the preformed element comprises a ball.

* * * * *